US012772436B2

(12) United States Patent
Kuo et al.

(10) Patent No.: US 12,772,436 B2
(45) Date of Patent: Oct. 20, 2026

(54) MEMORY DEVICE AND MANUFACTURING METHOD THEREOF

(71) Applicant: HON HAI PRECISION INDUSTRY CO., LTD., New Taipei City (TW)

(72) Inventors: Chao-Wei Kuo, Hsinchu City (TW); Mu-Yi Lin, Hsinchu City (TW)

(73) Assignee: HON HAI PRECISION INDUSTRY CO., LTD., New Taipei City (TW)

( * ) Notice: Subject to any disclaimer, the term of this patent is extended or adjusted under 35 U.S.C. 154(b) by 334 days.

(21) Appl. No.: 18/751,365

(22) Filed: Jun. 24, 2024

(65) Prior Publication Data

US 2025/0338477 A1 Oct. 30, 2025

(30) Foreign Application Priority Data

Apr. 26, 2024 (TW) ................................ 113115796

(51) Int. Cl.
*H10B 12/00* (2023.01)

(52) U.S. Cl.
CPC ......... *H10B 12/315* (2023.02); *H10B 12/033* (2023.02); *H10B 12/05* (2023.02)

(58) Field of Classification Search
CPC .... H10B 12/315; H10B 12/033; H10B 12/05; H10B 41/30
See application file for complete search history.

(56) References Cited

U.S. PATENT DOCUMENTS

2006/0134862 A1 6/2006 Parris et al.
2006/0186446 A1 8/2006 Kim et al.
2009/0242972 A1* 10/2009 Cho ..................... H10B 12/053 257/329
2012/0217562 A1 8/2012 Lee
2013/0153851 A1 6/2013 Park
2014/0353737 A1* 12/2014 Iwamoto ................ H10B 41/10 438/257
2015/0129950 A1 5/2015 Tempel et al.
2019/0393267 A1* 12/2019 Pillarisetty ......... H10B 12/0335
2023/0065465 A1* 3/2023 Lin ........................ G11C 11/005
2023/0164981 A1* 5/2023 Ryu .................... H10B 12/0335 257/213
2024/0064967 A1 2/2024 Hsu et al.
2024/0242759 A1* 7/2024 Chen ..................... G11C 11/405

FOREIGN PATENT DOCUMENTS

| | | | |
|---|---|---|---|
| DE | 102008002651 | A1 | 1/2009 |
| JP | H1174382 | A | 3/1999 |
| TW | I681539 | B | 1/2020 |
| TW | 202301567 | A | 1/2023 |
| TW | I817845 | B | 10/2023 |
| TW | 202347622 | A | 12/2023 |

* cited by examiner

*Primary Examiner* — Chad M Dicke
*Assistant Examiner* — Gary Abel
(74) *Attorney, Agent, or Firm* — CKC & Partners Co., LLC

(57) ABSTRACT

A memory device includes a transistor, a first metal layer over the transistor, and a second metal layer over the first metal layer. The transistor includes a gate layer, a source region, and a drain region, in which the source region and the drain regions are at two sides of the gate layer. The first metal layer includes a bit line electrically connected to the drain region of the transistor. The second metal layer includes a first gate metal layer electrically connected to the gate layer of the transistor, and a first word line surrounding the first gate metal layer.

15 Claims, 3 Drawing Sheets

MEMORY DEVICE AND MANUFACTURING METHOD THEREOF

CROSS-REFERENCE TO RELATED APPLICATION

This application claims priority to Taiwan Application Serial Number 113115796, filed Apr. 26, 2024, which is herein incorporated by reference in its entirety.

BACKGROUND

Field of Invention

The present invention relates to a memory device and a manufacturing method thereof.

Description of Related Art

Embedded Non-volatile Memory (eNVM) is a kind of non-volatile memory technique that is directly integrated and embedded in the chip to store the data. When the power is off, the data stored in the eNVM is still retained. However, the typical eNVM has complicated operations and manufacturing processes. Therefore, an eNVM having simple operations and manufacturing processes is required.

SUMMARY

Some embodiments of the present disclosure provide a memory device including a transistor, a first metal layer over the transistor, and a second metal layer over the first metal layer. The transistor includes a gate layer, a source region, and a drain region, in which the source region and the drain region are at two sides of the gate layer. The first metal layer includes a bit line electrically connected to the drain region of the transistor. The second metal layer includes a first gate metal layer electrically connected to the gate layer of the transistor, and a first word line surrounding the first gate metal layer.

Some embodiments of the present disclosure provide a manufacturing method of a memory device, including forming a transistor, forming a first metal layer over the transistor, and forming a second metal layer over the first metal layer. The transistor includes a gate layer, a source region, and a drain region, in which the source region and the drain region are at two sides of the gate layer. The first metal layer includes a bit line electrically connected to the drain region of the transistor. The second metal layer includes a first gate metal layer electrically connected to the gate layer of the transistor, and a first word line surrounding the first gate metal layer.

DETAILED DESCRIPTION

Some embodiments in the present disclosure are related to a memory device and a manufacturing method thereof, and the present disclosure is applicable to single poly embedded non-volatile memory (Single Poly eNVM), such as flash memory, electrically-erasable programmable read-only memory (EEPROM), one-time-programmable memory (OTP Memory), multiple-time programmable memory (MTP Memory). The process for forming the memory device is simple in the present disclosure, and fewer photomasks are used. Moreover, the operation method of the memory device in the present disclosure is easy.

Figure 1:
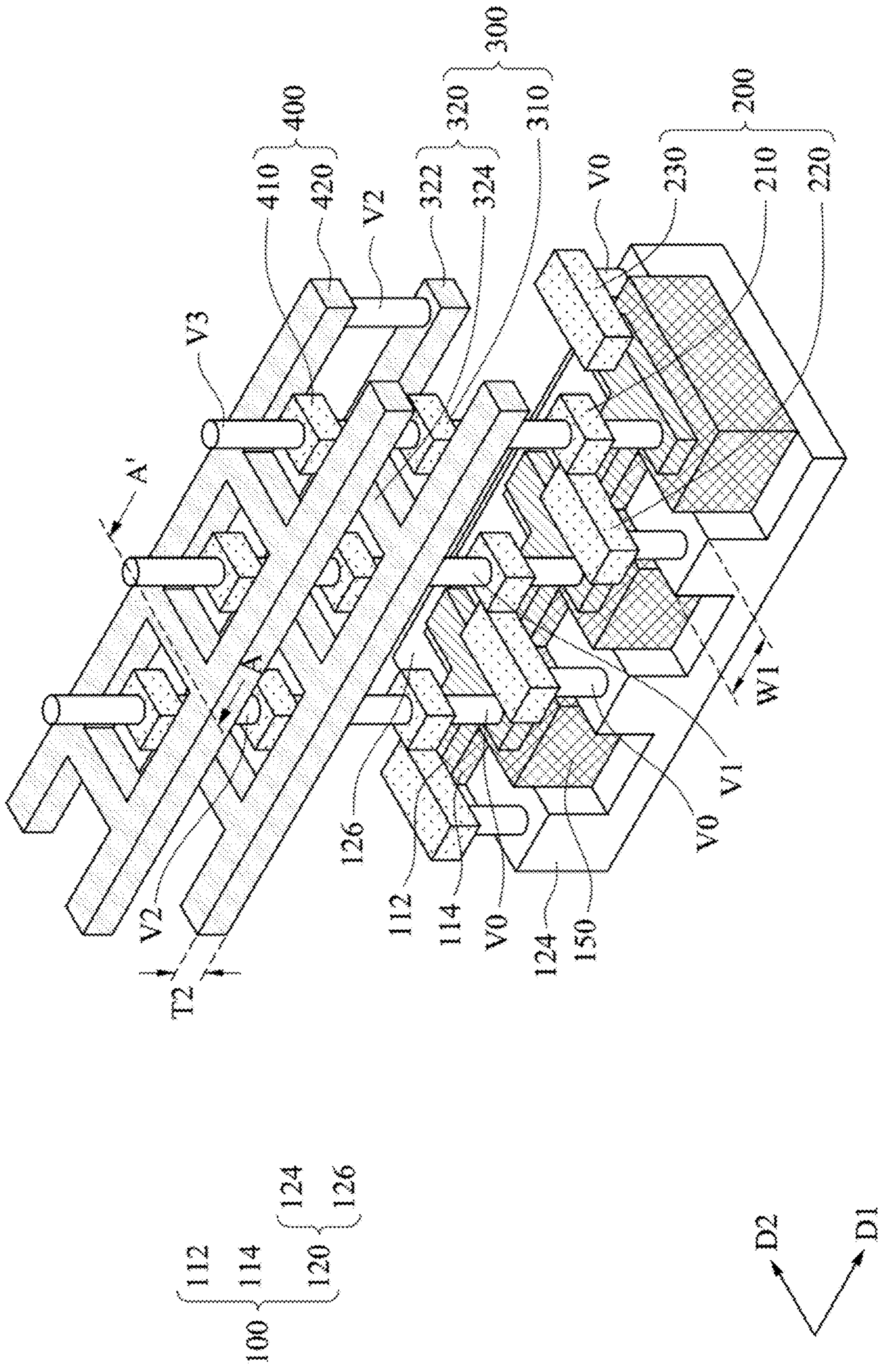
FIG. 1 illustrates a perspective view of a memory device in some embodiments of the present disclosure.
Figure 2:
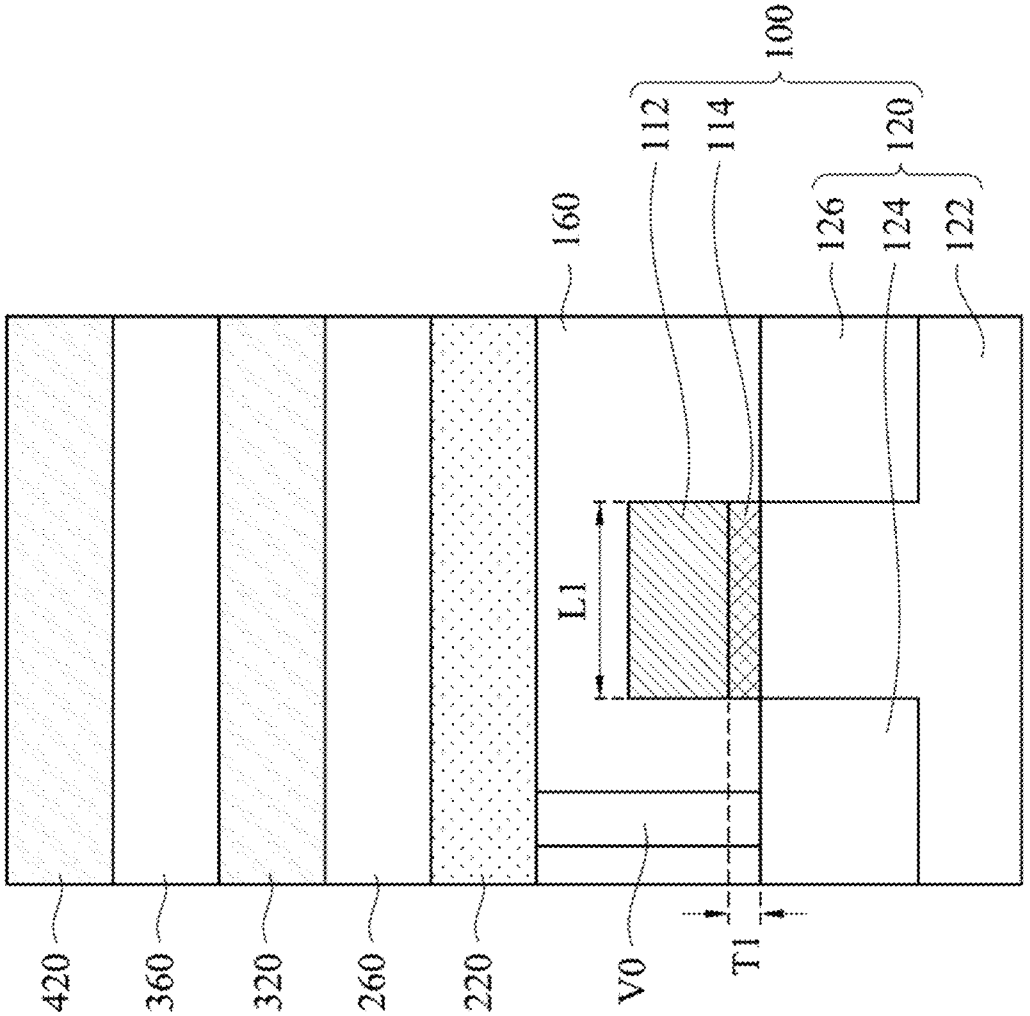
FIG. 2 illustrates a cross-section view taken along line A-A' in FIG. 1.

FIG. 1 illustrates a perspective view of a memory device in some embodiments of the present disclosure. FIG. 2 illustrates a cross-section view taken along line A-A' in FIG. 1. Referring to FIGS. 1 and 2, the memory device includes a plurality of transistors 100, a metal layer 200 and a metal layer 300. FIG. 1 illustrates a portion of the memory array in the memory device, such as a row of the memory array (arranging along the first direction D1). However, the memory array may be a 2-dimensional array (arranging along the first direction D1 and the second direction D2). It is noted that, some of the components (such as dielectric layer 160, dielectric layer 260 and the dielectric layer 360) are omitted in FIG. 1 to clearly describe the relative location of the components in FIG. 1.

The transistors 100 may be arranged along the first direction D1. Each of the transistors 100 includes a gate layer 112, a gate dielectric layer 114 and a semiconductor layer 120. The gate layer 112 is over the gate dielectric layer 114, and the gate dielectric layer 114 is over the semiconductor layer 120. In some embodiments, the gate dielectric layer 114 is a tunnel oxide layer. In some embodiments, the equivalent thickness T1 of the gate dielectric layer 114 is about 90 Å (FIG. 2), the length L1 of the gate dielectric layer 114 is about 0.05 micron (FIG. 2), and the width W1 of the gate dielectric layer 114 is about 0.05 micron. The semiconductor layer 120 includes a well region 122 (FIG. 2), a source region 126 and a drain region 124. The gate layer 112 and the gate dielectric layer 114 are over the well region 122, and the source region 126 and the drain region 124 are at two sides of the gate layer 112 and the gate dielectric layer 114 respectively. In some embodiments, the gate layer 112 may be made of conductive material, such as polysilicon. The gate dielectric layer 114 may be made of suitable oxide layer, such as silicon oxide. The semiconductor layer 120 may be made of semiconductive material, such as silicon, in which the conductivity type of the well region 122 is different from the conductivity type of the source region 126 and the drain region 124. For example, when the well region 122 is P-type, the source region 126 and the drain region 124 are N-type. When the well region 122 is N-type, the source region 126 and the drain region 124 are P-type. The well regions 122 of adjacent transistors 100 are separated by the isolation structures 150, and the drain regions 124 of adjacent transistors 100 are separated by the isolation structures 150. In some embodiments, the isolation structure 150 is made of dielectric material, such silicon oxide. The source regions 126 of adjacent transistors 100 are connected. In some embodiments, the gate layers 112 also extend over the isolation structures 150, but the adjacent gate layers 112 are still electrically isolated.

The metal layer 200 is over the transistors 100. In the present disclosure, the metal layer 200 is viewed as the first metal layer (M1), in which the metal layer 200 includes gate metal layers 210, bit lines 220 and a source line 230. The gate metal layers 210 are over the gate layers 112 and the gate dielectric layers 114 of the transistors 100 and are electrically connected to the gate layers 112 of the transistors 100. The bit lines 220 are electrically connected to the drain regions 124 of the transistors 100. The source line 230 is electrically to the source regions 126 of the transistors 100.

The electrical connection between the gate metal layers 210 and the gate layers 112, between the bit lines 220 and the drain regions 124, between the source line 230 and the source regions 126 are provided by vias V0. The longitudinal direction of the bit lines 220 and the source line 230 extends along the second direction D2 (it is noted that the bit lines 220 and the source line 230 are not illustrated as completely extending along the second direction D2 in the present disclosure to prevent the bit lines 220 and the source line 230 from covering other components and thus making the relationship between the components unclear). In the metal layer 200 along first direction D1, each of the bit lines 220 is between two adjacent gate metal layers 210. That is, the gate metal layers 210 and the bit lines 220 are alternately arranged. Moreover, one of the bit lines 220 and the source line 230 are at two sides of some of the gate metal layers 210. In the present disclosure, in the same row of the memory array (memory array as shown in FIG. 1), one drain region 124 of one transistor 100 corresponds with one bit line 220, and multiple source regions 126 of the transistors 100 correspond with one source line 230. The gate metal layers 210, the bit lines 220 and the source line 230 may be made of conductive material. In some embodiments, the gate metal layers 210, the bit lines 220 and the source line 230 may be made of the same material.

Figure 3:
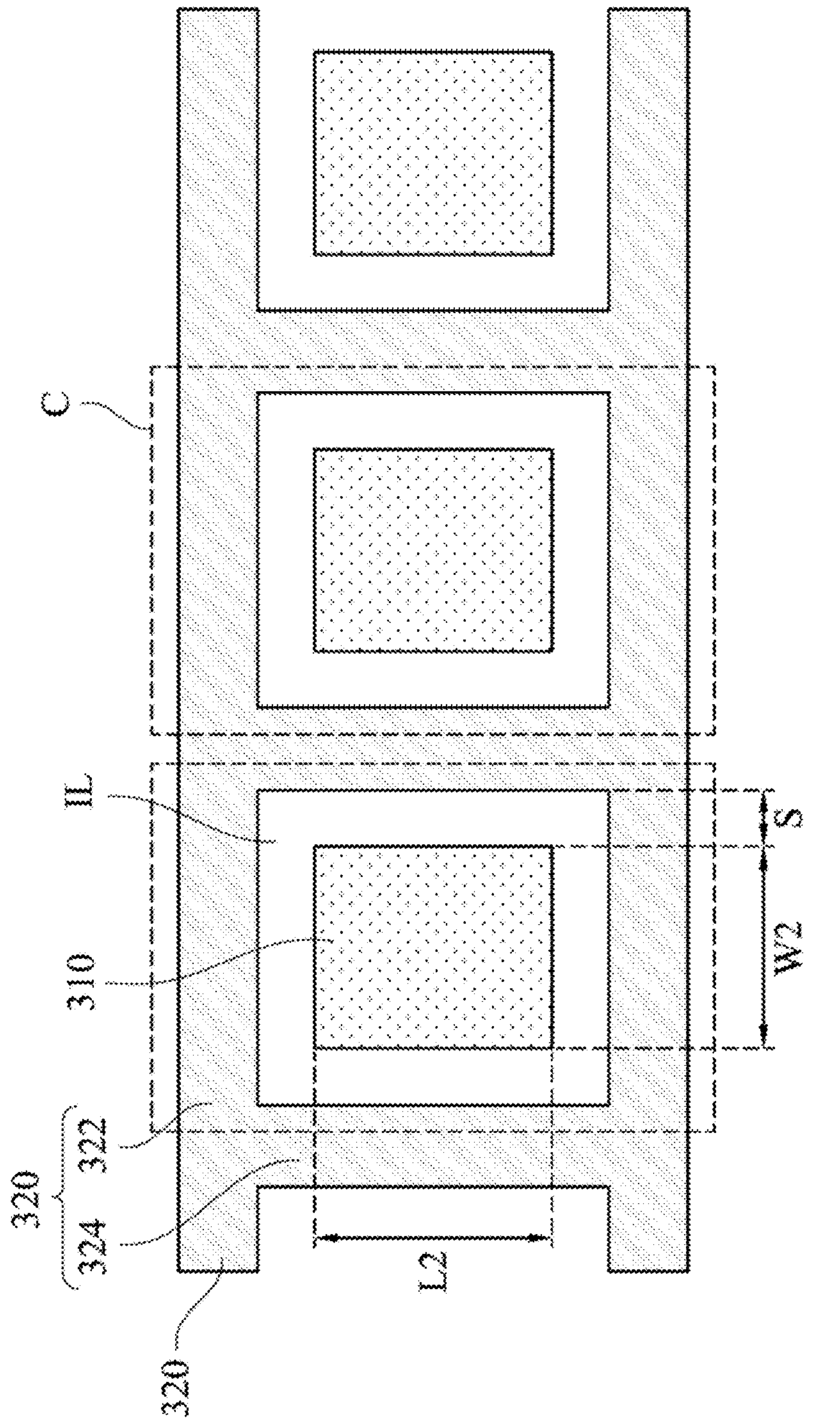
FIG. 3 illustrates a top view of the metal layer in FIG. 1.

The metal layer 300 is over the metal layer 200, and the metal layer 300 and the metal layer 200 have different patterns. In the present disclosure, the metal layer 300 may be viewed as the second metal layer (M2). FIG. 3 illustrates a top view of the metal layer 300 in FIG. 1. Referring to FIGS. 1 and 3, the metal layer 300 includes gate metal layers 310 and a word line 320. The gate metal layers 310 are electrically connected to the gate layers 112 of the transistors 100 and the gate metal layers 210 of the metal layer 200. The electrical connections between the gate metal layers 310 and the gate metal layers 210 are provided by vias V1. The gate metal layers 310 of the metal layer 300 may be aligned with the gate metal layers 210 of the metal layer 200, and the gate metal layers 310 and the gate metal layers 210 have substantially same patterns. The difference between the metal layer 300 and the metal layer 200 is that the metal layer 300 includes the word line 320, while the metal layer 200 includes the bit lines 220 and the source line 230. The word line 320 of the metal layer 300 surrounds the gate metal layer 310. Specifically, the word line 320 has two extending portions 322 and a plurality of connecting portions 324. The extending portions 322 of the word line 320 extend along the first direction D1 and are at two sides of the gate metal layer 310. The connecting portions 324 of the word line 320 connect two extending portions 322. As a result, the gate metal layer 310 is surrounded by the extending portions 322 and the connecting portions 324 of the word line 320. Specifically, in the metal layer 300, each of the connecting portions 324 of the gate metal layer 310 is between two adjacent gate metal layers 310. On the other hand, in the metal layer 200, each of the bit lines 220 rather than any portion of the word line is between two adjacent gate metal layers 210. In some embodiments, the connecting portions 324 of the word line 320 at least partially overlap the bit lines 220 in a vertical direction. In some embodiments, the thickness T2 of the word line 320 may be about 900 Å. In some embodiments, the gate metal layers 310 and the word line 320 may be made of conductive material. In some embodiments, the gate metal layers 310 and the word line 320 may be made of same material. In some embodiments, since the extending direction of the bit lines 220 and the source line 230 of the metal layer 200 (second direction D2) and that of the word line 320 of the metal layer 300 (first direction D1) are different, the word line 320 formed over the bit lines 220 and the source line 230 may prevent the wiring of the word line 320 from interfering the underlying bit lines 220 and the source line 230.

A dielectric layer IL is between the gate metal layers 310 and the word line 320 of the metal layer 300, and the metal layer 300 may be divided into multiple capacitors C. Each of the capacitors C includes the gate metal layer 310, the dielectric layer IL and the word line 320 arranged inside out. One capacitor C corresponds with one transistor 100 in the present disclosure. That is, the memory structure in the present disclosure is a 1T-1C structure. In some embodiments, the distance between the gate metal layer 310 and the word line 320 is about 0.045 micron. The length L2 of the gate metal layer 310 is about 0.05 micron. The width W2 of the gate metal layer 310 is about 0.045 micron.

Since the present disclosure provides a 1T-1C structure, the memory device in the present disclosure has an advantage of easy operation. Specifically, only specific voltages needs to be applied to the well regions 122, the drain regions 124 and the source regions 126 of the transistors 100 and the word line 320, to complete program (write), erase, and read operation of the memory device. In some embodiments, when performing the program operation, a VPP voltage may be applied to the word line 320, a −VPP voltage may be applied to the bit lines 220 (i.e. drain regions 124), and zero voltage may be applied to the source line 230 (i.e. source region 126) and the well regions 122. When performing the erase operation, a VEE voltage is applied to the well regions 122, and zero voltage is applied to the word line 320, the bit lines 220 (i.e. drain regions 124) and the source line 230 (i.e. source region 126). When performing the read operation, a VDD voltage is applied to the word line 320 and the bit lines 220 (i.e. drain regions 124), and zero voltage is applied to the source line 230 (i.e. source regions 126) and the well regions 122. The program operation and the erase operation of the data in the present disclosure are operated by Fowler-Nordheim tunneling. If the memory structure is not a 1T-1C structure as shown in the present disclosure, one capacitor may correspond with multiple transistors with different functions, and the operations of the memory device may become complicated.

Back to FIGS. 1 and 2, the memory structure may further include a metal layer 400. In the present disclosure, the metal layer 400 may be viewed as the third metal layer (M3). The metal layer 400 includes gate metal layers 410 and the word line 420. The gate metal layers 410 are electrically connected to the gate metal layers 310 of the metal layer 300. The word line 420 is electrically connected to the word line 320 of the metal layer 300. The electrical connections between the gate metal layers 410 and the gate metal layers 310, between the word line 420 and the word line 320 may be provided by vias V2. The gate metal layers 410 of the metal layer 400 may be aligned with the gate metal layers 310 of the metal layer 300, and the gate metal layers 410 and the gate metal layers 310 may have substantially same patterns. The word line 420 surrounds the gate metal layers 410. The word line 420 of the metal layer 400 may be aligned with the word line 320 of the metal layer 300, and the word line 420 and the word line 320 may have substantially same patterns. In some embodiments, the top view of the metal layer 400 may also be shown in FIG. 3. The gate metal layers 410 and the word line 420 may be made of conductive material. In some embodiments, the gate metal layer 410 and the word line 420 may be made of same material.

In some embodiments, the memory device in the present disclosure may further include other metal layers stacked upwards, and there are vias V3 over the metal layer 400 to electrically connect the metal layer 400 to the metal layers above. In the present disclosure, the metal layer 200 does not include the word line, while other metal layers all include the gate metal layers and the word line. The patterns of the gate metal layers in different metal layers are the same, and the pattern of the word lines in different metal layers are the same. The coupling ratio of the memory device may be increased by adding different numbers of the metal layers. In some embodiments, the memory device in the present disclosure may include two metal layers to eight metal layers. In the present disclosure, a gate layer 112, a via V0, a gate metal layer 210, a via V1, a gate metal layer 310, a via V2, a gate metal layer 410 and a via V3 may be collectively referred as to a floating gate structure.

The memory device in the present disclosure has an advantage of simple manufacturing process. Specifically, in the manufacturing process of the memory device in the present disclosure, the transistors 100 are formed, and then the metal layer 200, the metal layer 300 and the metal layer 400 are sequentially formed.

In some embodiments, before forming the transistors 100, the isolation structures 150 are formed in the semiconductor layer 120, and then the transistors 100 are formed. The formation of the transistors 100 includes forming the gate dielectric layers 114 and the gate layers 112 over the semiconductor layer 120, and then performing an ion implantation process to the semiconductor layer 120 to form the source regions 126 and the drain regions 124 at two sides of the gate layers 112. The remaining portion of the semiconductor layer 120 may be referred to as the well regions 122. After forming the transistors 100, a dielectric layer 160 is formed over the transistors 100, and the vias V0 are formed in the dielectric layer 160. The vias V0 may electrically connect to the gate layers 110, the source regions 126 and the drain regions 124 of the transistors 100.

Subsequently, the metal layer 200 is formed over the transistors 100. The formation of the metal layer 200 may include forming a dielectric layer over the dielectric layer 160, and then patterning the dielectric layer. Subsequently, the gate metal layers 210, the bit lines 220 and the source line 230 are formed in the dielectric layer. The gate metal layers 210, the bit lines 220 and the source line 230 are all connected to the vias V0 to electrically connect to underlying components. After forming the metal layer 200, a dielectric layer 260 is formed over the metal layer 200, and the vias V1 are formed in the dielectric layer 260. The vias V1 are electrically connected to the gate metal layers 210.

Subsequently, the metal layer 300 is formed over the metal layer 200. The formation of the metal layer 300 may include forming a dielectric layer over the dielectric layer 260, and then patterning the dielectric layer. Subsequently, the gate metal layers 310 and the word line 320 are formed in the dielectric layer. The gate metal layers 310 are connected to the vias V1 to electrically connect to underlying components. After forming the metal layer 300, a dielectric layer 360 is formed over the metal layer 300, and the vias V2 are formed in the dielectric layer 360. The vias V2 are electrically connected to the gate metal layers 310 and the word line 320.

Subsequently, the metal layer 400 is formed over the metal layer 300. The formation of the metal layer 400 may include forming a dielectric layer over the dielectric layer 360, and then patterning the dielectric layer. Subsequently, the gate metal layers 410 and the word line 420 are formed in the dielectric layer. The gate metal layers 410 and the word line 420 are connected to the vias V2 to electrically connect to underlying components. After forming the metal layer 400, an additional dielectric layer may be formed over the metal layer 400, and the vias V3 are formed in the dielectric layer. The vias V3 electrically connect the gate metal layers 410 and the metal layer above.

In the present disclosure, the gate metal layers 210, the gate metal layers 310 and the gate metal layers 410 (and gate metal layers of other metal layer) are formed by the same photomask, so the gate metal layers 210, the gate metal layers 310 and the gate metal layers 410 have substantially same patterns. The word line 320 and the word line 420 (and word line of other metal layers) are formed by the same photomask, so the word line 320 and the word line 420 have substantially same patterns. As a result, the manufacturing process of the memory device in the present disclosure is simple. For example, fewer photomasks are used to form the memory device in the present disclosure.

As mentioned above, the manufacturing process and the operation method of the memory device in the present disclosure are simple. Specifically, fewer photomasks are used to form the memory device in the present disclosure, and the manufacturing process of the memory device in the present disclosure is simplified. Moreover, the memory device in the present disclosure is a 1T-1C structure. Therefore, when performing the program, erase and read operation of the data, it is only needed to apply different voltages to components of a single transistor. The procedure of operation of the memory device is thus simplified.

What is claimed is:

1. A memory device, comprising:
- a transistor, comprising:
  - a gate layer;
  - a source region; and
  - a drain region, wherein the source region and the drain region are at two sides of the gate layer;
- a first metal layer over the transistor, wherein the first metal layer comprises:
  - a bit line electrically connected to the drain region of the transistor; and
- a second metal layer over the first metal layer, wherein the second metal layer comprises:
  - a first gate metal layer electrically connected to the gate layer of the transistor; and
  - a first word line surrounding the first gate metal layer.

2. The memory device of claim 1, wherein the first metal layer further comprises:
- a second gate metal layer electrically connected to the first gate metal layer of the second metal layer and the gate layer of the transistor.

3. The memory device of claim 1, wherein the first metal layer further comprises:
- a source line electrically connected to the source region of the transistor.

4. The memory device of claim 1, further comprising a third metal layer over the second metal layer, wherein the third metal layer comprises:
- a third gate metal layer electrically connected to the first gate metal layer of the second metal layer; and
- a second word line surrounding the third gate metal layer.

5. The memory device of claim 4, wherein the first word line of the second metal layer and the second word line of the third metal layer have the same patterns.

6. The memory device of claim 4, wherein the first gate metal layer of the second metal layer and the third gate metal layer of the third metal layer have the same patterns.

7. The memory device of claim 1, further comprising:
a dielectric layer between the first gate metal layer and the first word line of the second metal layer.

8. The memory device of claim 1, wherein the first word line of the second metal layer comprises two extending portions and a plurality of connecting portions, the extending portions of the first word line extend along a first direction and are at two sides of the first gate metal layer, and the connecting portions of the first word line connect the extending portions.

9. The memory device of claim 8, wherein one of the connecting portions of the first word line at least partially overlaps the bit line in a vertical direction.

10. A manufacturing method of a memory device, comprising:
forming a transistor, wherein the transistor comprising:
a gate layer;
a source region; and
a drain region, wherein the source region and the drain region are at two sides of the gate layer;
forming a first metal layer over the transistor, wherein the first metal layer comprises:
a bit line electrically connected to the drain region of the transistor; and
forming a second metal layer over the first metal layer, wherein the second metal layer comprises:
a first gate metal layer electrically connected to the gate layer of the transistor; and
a first word line surrounding the first gate metal layer.

11. The method of claim 10, further comprising forming a third metal layer over the second metal layer, wherein the third metal layer comprises:
a second gate metal layer electrically connected to the first gate metal layer of the second metal layer; and
a second word line surrounding the second gate metal layer.

12. The method of claim 11, wherein the first word line of the second metal layer and the second word line of the third metal layer are formed by the same photomask.

13. The method of claim 11, wherein the first gate metal layer of the second metal layer and the second gate metal layer of the third metal layer are formed by the same photomask.

14. The method of claim 10, wherein the first metal layer further comprises:
a third gate metal layer electrically connected to the first gate metal layer of the second metal layer and the gate layer of the transistor, wherein the first gate metal layer of the second metal layer and the third gate metal layer of the first metal layer are formed by the same photomask.

15. The method of claim 10, wherein the first metal layer further comprises:
a source line electrically connected to the source region of the transistor, wherein the first word line of the second metal layer extends along a first direction, and the bit line and the source line of the first metal layer extends along a second direction different from the first direction.

* * * * *